June 26, 1962 A. GOETZBERGER 3,041,214

METHOD OF FORMING JUNCTION SEMICONDUCTIVE DEVICES
HAVING THIN LAYERS

Filed Sept. 25, 1959

ADOLPH GOETZBERGER
*INVENTOR.*

*BY* Flehr and Swain
ATTORNEYS

United States Patent Office 3,041,214
Patented June 26, 1962

3,041,214

METHOD OF FORMING JUNCTION SEMICONDUCTIVE DEVICES HAVING THIN LAYERS

Adolph Goetzberger, Palo Alto, Calif., assignor, by mesne assignments, to Clevite Corporation, Cleveland, Ohio, a corporation of Ohio Filed Sept. 25, 1959, Ser. No. 842,464
5 Claims. (Cl. 148—1.5)

This invention relates generally to a method of forming by diffusion junction semiconductive devices having thin layers.

The diffusion of impurities into a wafer is usually done in two steps: (1) a predeposition at relatively low temperatures in a non-oxidizing atmosphere; and (2) a subsequent high temperature diffusion in an oxidizing atmosphere.

As is well known, predeposition is carried out at low temperatures in a non-oxidizing atmosphere to prevent formation of oxide. The process is slower whereby the amount of impurities deposited can be more closely controlled.

The diffusion at high temperature under oxidizing conditions causes rapid diffusion of the predeposited impurities into the crystal. The oxide layer which is formed tends to prevent evaporation of impurities from the surface and causes them to penetrate into the wafer. The oxidizing coating also minimizes erosion of the wafer.

The uniformity of penetration is dependent largely upon the uniformity of predeposition. It is difficult to provide wafers whose surfaces are free of particles (i.e. dust and the like), and it is believed that such particles act in one of two ways: (1) They cover a very tiny spot on the surface and prevent impurities from entering at this spot or; (2) they act to increase the deposit and form a local source of higher impurity concentration. In either event, the layer formed during a subsequent diffusion will not be uniform and in some instances will not be continuous. When a second diffusion is carried out to form a three layer device, the center layer may short through at the points of decreased or increased concentration.

It is a general object of the present invention to provide an improved method for making relatively uniform thin layers on semiconductive devices.

It is another object of the present invention to provide a method which minimizes the effect of particles on the surface of a cleaned wafer.

It is still a further object of the present invention to provide a method of making thin layers by multiple predepositions.

These and other objects of the invention will become more clearly apparent from the following description when taken in conjunction with the accompanying drawing.

Referring to the drawings.

Figure 1:
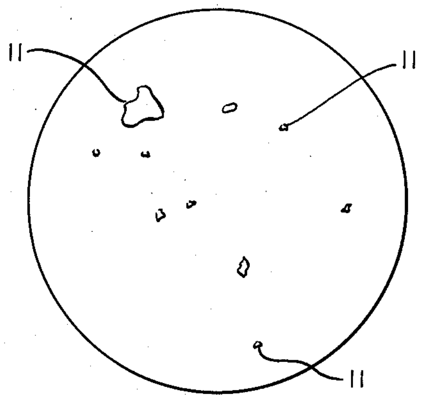
FIGURE 1 shows a magnified view (500 times) of the surface of a wafer which has been cleaned.

In testing junctions formed by a single predeposition and a subsequent diffusion, it was found that there was a certain degree of non-uniformity in the diffused layer.

These non-uniformities were reflected by a variation of the *V/I* values at various locations on the wafer, spots in the diffused surface which resulted in shorts through very thin layers of transistors made from the samples, and poor electrical characteristics of the very thin layers, such as a lower breakdown voltage in some spots of the wafer and softness of the junction. The spots are observed by means of light emission at breakdown.

It is believed that these effects were due to either dislocations in the silicon lattice or by minute dust particles lying on the surface of the silicon. The number of faulty spots observed in the diffused layer, in general, were much higher in number than the dislocations predicted for the wafer. Therefore, it was concluded that the particles on the surface cause most of the observed faults. With usual cleaning methods such as removing oxide layers by washing in hydrofluoric acid, a low number of particles on the surface can be obtained. However, for very thin layers, the number of particles which remain is still exceedingly large.

In accordance with the present invention, relatively thin layers are formed by multiple predepositions. Carefully cleaned slices are subjected to multiple predepositions. Thus, the slices are cleaned in hydrofluoric acid or the like cleaning agent and then subjected to a relatively low temperature predeposition 900° or less in a non-oxidizing atmosphere. After the wafer has been predeposited for a certain period of time, the wafer is removed, again washed in hydrofluoric acid for a predetermined period of time, rinsed and dried. The whole procedure is then repeated several more times.

For example, carefully cleaned p-type silicon slices were predeposited in dry $N_2$ gas at temperatures of 700° C. and 800° C. The $P_2O_5$ source was at a temperature of 210° C., aged for 15 minutes, and the time of predeposition was varied between 10 and 30 minutes. After predeposition, the $P_2O_5$-$SiO_2$ glass-like layer which was formed during the predeposition process was removed by treatment in hydrofluoric acid for approximately five minutes. The wafer was then rinsed and dried and the procedure repeated several more times to give a plurality of predepositions.

N-type wafers were similarly subjected to multiple predepositions. For the predeposition, $B_2O_3$ was used as the source which was enclosed together with the silicon slices in a platinum box. Because of the large time which is required for the platinum box to stabilize in temperature and vapor pressure, a longer predeposition time than that described above is employed. Again, the procedure is repeated several times.

The results of multiple predepositions with $P_2O_5$ are shown in the following table:

TABLE I

*Phosphorus Predeposition*

| Temp., ° C. | Time, minutes | No. of Predep. | V1/I |
|---|---|---|---|
| 700 | 30 | 1 | 1,270±191 |
| | | 2 | 1,170±184 |
| | | 3 | 612±9.6 |
| 800 | 10 | 1 | 69.0±2.0 |
| | | 2 | 57.5±1.7 |
| | | 3 | 47.7±0.43 |
| 800 | 30 | 1 | 37.3±1.1 |
| | | 2 | 24.0±0.5 |
| | | 3 | 16.3±0.1 |

Figure 7:
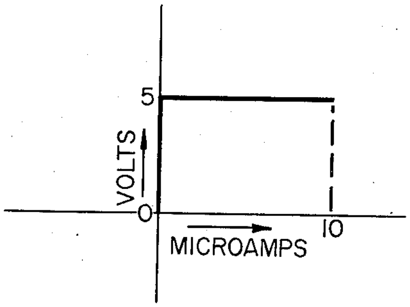
FIGURE 7 shows the voltage response of a p-n junction formed in accordance with the present invention.

It is noted from Table I that the uniformity of the layer increases with the number of predepositions as indicated by the (±) variations from the basic value of *V/I*. It was further noted that with multiple predeposition it was possible to produce very thin diffused layers varying between 0.2 and 0.4 micron. These junctions showed very hard avalanche breakdown, FIGURE 7. On observing a sample of the foregoing type with voltage applied to the junction, approximately ten local breakdowns per $mm.^2$ were observed. This is about 10 to 20 times less than after a single predeposition. A uniform glow over a large area of the surface can be observed at slightly higher voltages than is necessary to cause breakdown in the microplasmas.

The results indicate that uniformity of thin diffused layers can be improved by multiple predepositions. The hydrofluoric acid washing treatment during each predeposition is believed to remove most of the surface contaminations which are due to the previous chemical treatment and diffusion. Others may settle down before the next predeposition starts. However, the new contaminating particles are in locations which have been doped uniformly during the previous depositions. Repeated washings also decrease the probability that the silicon oxide layer is not completely dissolved. As is well known, a silicon oxide layer would result in lower surface concentration because of the masking effect.

Figure 2:
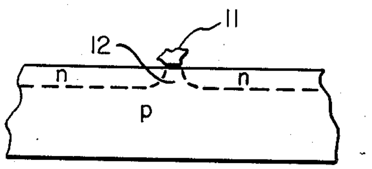
FIGURE 2 shows one possible explanation for the effect of surface particles.
Figure 4:
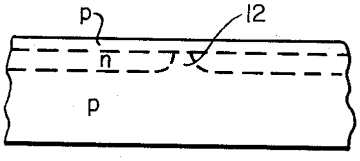
FIGURE 4 shows a three layer device formed from the two layer device of FIGURE 2.
Figure 3:
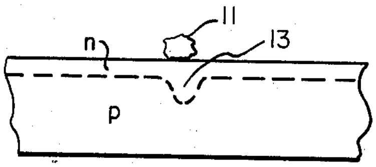
FIGURE 3 shows another possible explanation for the effect of surface particles.
Figure 6:
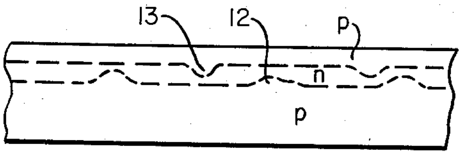
FIGURE 6 is a sectional view of a three layer wafer.
Figure 5:
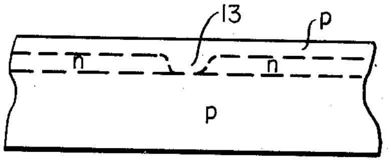
FIGURE 5 shows a three layer device formed from the two layer device of FIGURE 3.

Referring to FIGURE 1, a slice of semiconductive material which has been enlarged approximately 500 times is illustrated. It is seen that particles 11 are disposed on the surface of the wafer. The effects of these particles are believed to be as shown in FIGURES 2 or 3, or both. For example, in FIGURE 2, it is seen that the particle 11 serves to mask the underlying p-type material and prevents deposition (doping) beneath the particle to form a spot or hole 12; while in FIGURE 3, the particle has the effect of increasing the deposition (doping) to form a localized region of increased concentration which penetrates more deeply as shown at 13. When three layer devices are formed by an additional diffusion step, the two layer devices of FIGURES 2 and 3 react as shown in FIGURES 4 and 5, respectively. It is seen that the center or base n-type layer is shorted out by the area 12 not doped in FIGURE 4 or by the area of higher doping 13, FIGURE 5. However, when one refers to FIGURE 6 in which multiple prediffusions have been carried out, it is seen that the regions of decreased concentration and increased concentration have their amplitude minimized whereby they do not penetrate or short through the layers.

I claim:

1. The method of forming a junction device having at least one thin uniform layer comprising the steps of predepositing impurities of opposite conductivity type into a wafer of one conductivity type by placing the wafer in an atmosphere including a vapor capable of depositing impurities of said opposite conductivity type on said wafer at a temperature below 900° C., washing the predeposited wafer in hydrofluoric acid, subsequently washing the wafer in water, and again predepositing by placing the wafer in an atmosphere including a vapor capable of depositing impurities of said opposite conductivity type on said wafer at a relatively low temperature to diffuse further impurities of said opposite conductivity type into the wafer.

2. The method of forming a junction semiconductor device having at least one thin uniform layer comprising the steps of predepositing impurities of opposite conductivity type on at least one surface of a wafer of one conductivity type by placing the wafer of one conductivity type at an elevated temperature in an atmosphere containing impurities of opposite conductivity type, said predeposition forming a surface layer and a thin layer of opposite conductivity type diffused into the wafer, subsequently etching off the surface layer, and again predepositing impurities of said opposite conductivity type on said one surface of said wafer by again placing the wafer at an elevated temperature in an atmosphere containing impurities of said opposite conductivity type.

3. The method of forming a junction semiconductor device having at least one thin uniform layer comprising the steps of predepositing impurities of opposite conductivity type on at least one surface of a wafer of one conductivity type by placing the wafer of said one conductivity type at an elevated temperature for a predetermined time in a non-oxidizing atmosphere containing impurities of opposite conductivity type, said predeposition forming a surface layer and a diffused layer of opposite conductivity type extending into the wafer, etching off the surface layer, and again predepositing impurities of said opposite conductivity type on said surface of said wafer by placing the wafer at an elevated temperature for a predetermined time in a non-oxidizing atmosphere containing impurities of said opposite conductivity type.

4. The method of forming a junction semiconductor device having at least one thin uniform layer comprising the steps of predepositing impurities of opposite conductivity type on at least one surface of a wafer of one conductivity type, placing the wafer at an elevated temperature for a predetermined period of time in an atmosphere containing impurities of said opposite conductivity type, said predeposition forming a surface layer and a thin diffused layer of opposite conductivity type, etching the surface layer from said surface, and again predepositing impurities of said opposite conductivity type on said surface by placing a wafer of one conductivity type at an elevated temperature for a predetermined period of time in an atmosphere containing impurities of opposite conductivity type.

5. The method of forming a junction device having at least one thin uniform layer comprising the steps of predepositing impurities of opposite conductivity type onto at least one surface of a wafer of one conductivity type by placing the wafer of said one conductivity type at an elevated temperature for a predetermined period of time in an atmosphere containing impurities of opposite conductivity type, said predeposition forming a surface layer and a thin diffused layer of opposite conductivity type, etching off the surface layer, and subsequently forming a layer of the same conductivity type on said one surface to form a rectifying junction with the thin layer to thereby form a device having a relatively thin interior layer.

References Cited in the file of this patent

UNITED STATES PATENTS

| | | |
|---|---|---|
| 2,779,877 | Lehovec | Jan. 29, 1957 |
| 2,794,846 | Fuller | June 4, 1957 |
| 2,804,405 | Derick | Aug. 27, 1957 |